United States Patent
Lou

(10) Patent No.: US 11,968,873 B2
(45) Date of Patent: Apr. 23, 2024

(54) DISPLAY SUBSTRATE AND DISPLAY DEVICE

(71) Applicant: KunShan Go-Visionox Opto-Electronics Co., Ltd., Kunshan (CN)

(72) Inventor: Junhui Lou, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 448 days.

(21) Appl. No.: 17/502,363

(22) Filed: Oct. 15, 2021

(65) Prior Publication Data
US 2022/0037428 A1    Feb. 3, 2022

Related U.S. Application Data

(63) Continuation of application No. PCT/CN2020/087552, filed on Apr. 28, 2020.

(30) Foreign Application Priority Data

Sep. 26, 2019    (CN) .......................... 201921620029.4

(51) Int. Cl.
*H01L 51/52*    (2006.01)
*H10K 50/828*    (2023.01)
(Continued)

(52) U.S. Cl.
CPC ......... *H10K 59/353* (2023.02); *H10K 50/828* (2023.02); *H10K 59/352* (2023.02);
(Continued)

(58) Field of Classification Search
CPC .. H10K 59/353; H10K 50/828; H10K 59/352; H10K 59/60; H10K 2102/102;
(Continued)

(56) References Cited

U.S. PATENT DOCUMENTS

2019/0265526 A1    8/2019    Chae et al.

FOREIGN PATENT DOCUMENTS

CN    107610635 A    1/2018
CN    108364957 A    8/2018
(Continued)

OTHER PUBLICATIONS

International Search Report dated Jul. 28, 2020 in corresponding International application No. PCT/CN2020/087552; 5 pages.
(Continued)

*Primary Examiner* — Donald L Raleigh
(74) *Attorney, Agent, or Firm* — Maier & Maier, PLLC

(57) ABSTRACT

A display substrate and a display device. The display substrate includes a first display area and a second display area. A light transmittance of the second display area is lower than a light transmittance of the first display area. Among the sub-pixel groups of each pixel unit in the first display area, first electrodes of sub-pixels of sub-pixel groups of the pixel unit are electrically connected to corresponding pixel circuits through first connecting portions, and first electrodes of sub-pixels of the other sub-pixel groups of the pixel unit are electrically connected to corresponding pixel circuits through second connecting portions, the first connecting portions and the second connecting portions are disposed in different layers, and the second connecting portion and a plurality of first electrodes of a plurality of sub-pixels of the sub-pixel groups of the pixel unit are disposed in different layers.

20 Claims, 5 Drawing Sheets

(51) Int. Cl.
*H10K 59/35* (2023.01)
*H10K 59/60* (2023.01)
*H10K 102/10* (2023.01)

(52) U.S. Cl.
CPC ....... *H10K 59/60* (2023.02); *H10K 2102/102* (2023.02); *H10K 2102/103* (2023.02)

(58) Field of Classification Search
CPC ........... H10K 2102/103; H10K 59/131; H10K 59/123; H10K 59/121; H10K 59/65; G09F 9/30
See application file for complete search history.

(56) References Cited

FOREIGN PATENT DOCUMENTS

| | | | |
|---|---|---|---|
| CN | 108389879 | A | 8/2018 |
| CN | 208607570 | U | 3/2019 |
| CN | 110061038 | A | 7/2019 |
| CN | 209071333 | U | 7/2019 |
| CN | 110189639 | A | 8/2019 |
| CN | 110265455 | A | 9/2019 |

OTHER PUBLICATIONS

Written Opinion of the International Searching Authority dated Jul. 28, 2020 in corresponding International application No. PCT/CN2020/087552; 5 pages including Partial Machine-generated English-language translation.

DISPLAY SUBSTRATE AND DISPLAY DEVICE

CROSS REFERENCE TO RELATED APPLICATIONS

The present application is a continuation of International Application No. PCT/CN2020/087552, entitled "DISPLAY SUBSTRATE AND DISPLAY DEVICE", and filed on Apr. 28, 2020. International Application No. PCT/CN2020/087552 claims priority to Chinese Patent Application No. 201921620029.4 entitled "DISPLAY SUBSTRATE AND DISPLAY DEVICE" filed on Sep. 26, 2019. The entire contents of each of the above-listed applications are hereby incorporated by reference for all purposes.

TECHNICAL FIELD

This application relates to the field of display technology.

BACKGROUND

Electronic devices such as mobile phones, and tablet computers, or the like, need to integrate front cameras, earpieces, and infrared sensing elements. Usually, cameras, earpieces, and infrared sensing elements can be disposed in notch areas on the displays; or openings are provided on the screen to introduce external light into photosensitive elements disposed under the screens through the openings on the screens.

SUMMARY

According to a first aspect of the embodiments of the present application, there is provided a display substrate, the display substrate including a first display area comprising a plurality of pixel units, and each of the plurality of pixel units comprising at least three sub-pixel groups emitting light of at least three different colors; each of the sub-pixel groups comprising at least one sub-pixel, and each sub-pixel comprising a first electrode, a light emitting structure disposed on the first electrode and a second electrode disposed on the light emitting structure; and a second display area being adjacent to the first display area, a light transmittance of the second display area being lower than a light transmittance of the first display area; the second display area being provided with a plurality of pixel circuits for driving the sub-pixel groups; wherein among the sub-pixel groups of each pixel unit in the first display area, at least one first electrode of at least one sub-pixel of at least one sub-pixel group of the pixel unit is electrically connected to at least one corresponding pixel circuit through at least one first connecting portion, and at least one first electrode of at least one sub-pixel of at least one of the other sub-pixel groups of the pixel unit is electrically connected to at least one corresponding pixel circuit through at least one second connecting portion, the at least one first connecting portion and the at least one second connecting portion are disposed in different layers, and the at least one second connecting portion and a plurality of first electrodes of a plurality of sub-pixels of the sub-pixel groups of the pixel unit are disposed in different layers.

According to a second aspect of the embodiments of the present application, a display device is provided, including:
a device body has a component area;
the above-mentioned display substrate covering on the device body;
wherein the component area is disposed under the first display area, and t least one photosensitive component emitting or collecting light through the first display area is disposed in the component area.

In the display substrate and the display device provided by the embodiments of the present application, the light transmittance of the first display area is higher than the light transmittance of the second display area, and the photosensitive device can be arranged under the first display area, which can effectively ensure the normal operation of the photosensitive device while realize a full-screen display. The pixel circuits corresponding to the sub-pixel groups in the first display area are arranged in the second display area, which can increase the light transmittance of the first display area and reduce the structural complexity of the first display area, thereby reducing the diffraction effect generated when external light passes through the first display area, improving the imaging quality of the camera arranged under the first display area. A first electrode of at least one sub-pixel group in the first display area is electrically connected to a corresponding pixel circuit through a first connecting portion, and a first electrode of at least another sub-pixel group is electrically connected to a corresponding pixel circuit through a second connecting portion, the first connecting portion and the second connecting portion are disposed on different layers. Compared with the solution in which the first connecting portion and the second connecting portion are arranged on the same layer, the number of the first connecting portions and the second connecting portions can be increased. Because the total number of the first connecting portions and the second connecting portions is the same as the number of sub-pixel groups, and the second connecting portion and the first electrode are disposed in different layers, so that more sub-pixel groups can be provided, which can effectively increase the pixel density of the first display area, thereby improving display effect of the display area.

DETAILED DESCRIPTION

Figure 1:
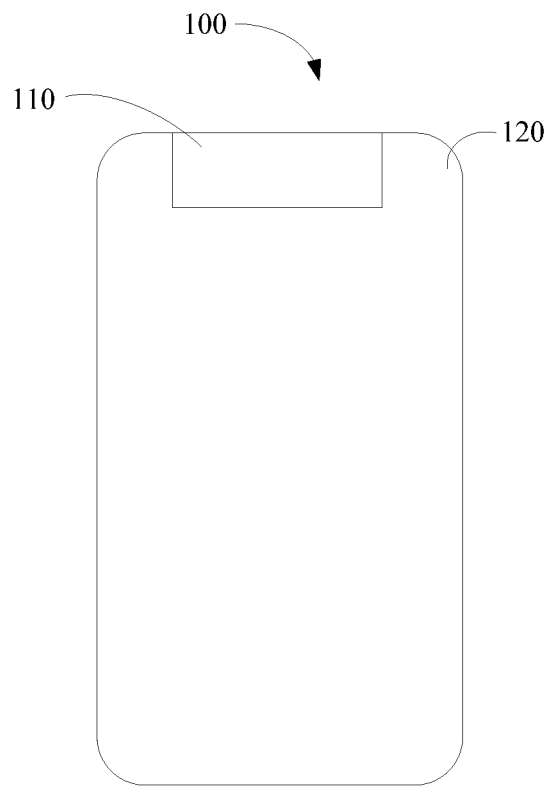
FIG. 1 is a top view of a display substrate provided by an embodiment of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

In smart electronic devices such as mobile phones and tablet computers, due to the need to integrate photosensitive devices such as front cameras, light sensors, etc., a transparent display area is usually provided on the electronic device, and the photosensitive device is placed under the transparent display area.

In order to improve the transparency of the transparent display area and reduce the structural complexity of the transparent display area, a pixel circuit corresponding to pixels in the transparent display area is usually provided in a non-transparent display area, and the pixels in the transparent display area are connected to the corresponding pixel circuit through wirings. The wirings between the pixels in the transparent display area and the corresponding pixel circuit are all disposed on the same layer. However, in order to ensure the normal operation of the pixels, the wirings cannot cross over each other, and because the wirings correspond to the pixels one-to-one, the number of traces is relatively small, resulting in a small number of pixels in the transparent display area, that is, the pixel density of the transparent display area is relatively small, which affects the display effect of the transparent display area.

In order to solve the above-mentioned problems, embodiments of the present application provide a display substrate, a display panel, and a display device.

The display substrate and the display device in the embodiments of the present application will be described in detail below with reference to the accompanying drawings. The following features in the embodiments and implementations can be mutually supplemented or combined with each other without conflict.

An embodiment of the present application provides a display substrate. As shown in FIG. 1, the display substrate 100 includes a first display area 110 and a second display area 120. The first display area 110 has a light transmittance higher than a light transmittance of the second display area 120, and a full-screen display of the display substrate 100 can be realized while effectively ensuring the normal operation of the photosensitive device.

Figure 2:
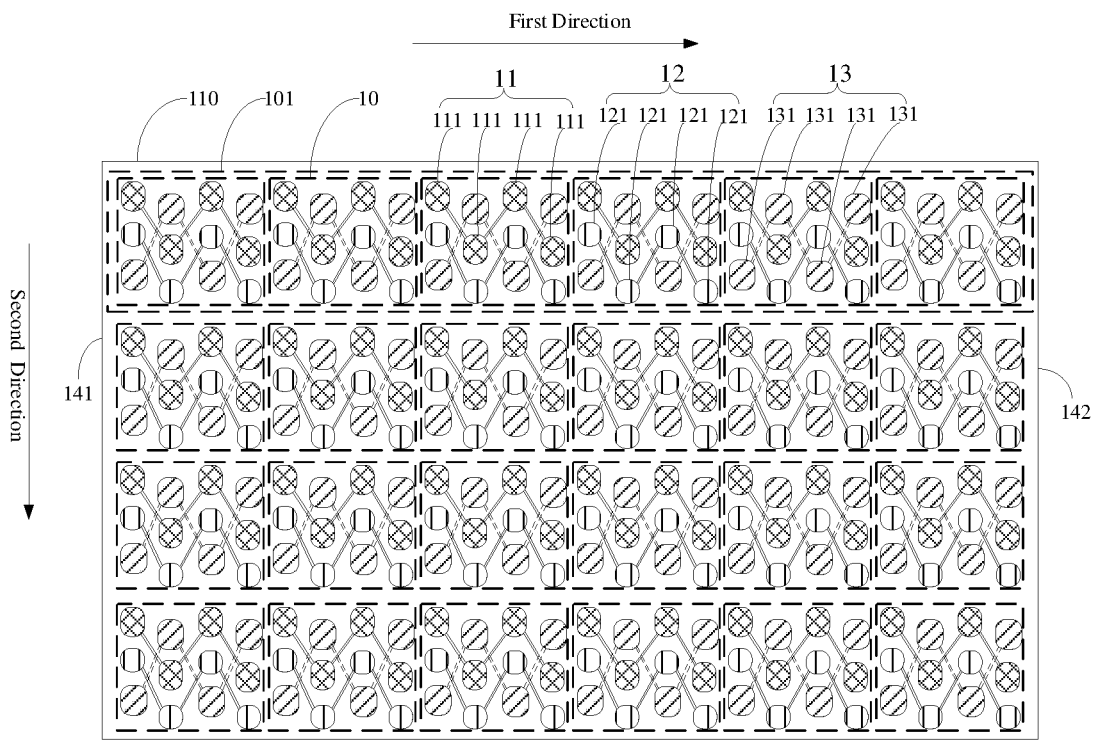
FIG. 2 is a schematic diagram of arrangement of sub-pixel groups in a first display area of a display substrate shown in FIG. 1.

As shown in FIG. 2, the first display area 110 includes a plurality of pixel units 10, and each of the plurality of pixel units 10 including at least three sub-pixel groups 11, 12, and 13 emitting light of at least three different colors. Each of the sub-pixel groups includes at least one sub-pixel 111, 121, 131, and each sub-pixel 111, 121, 131 includes a first electrode, a light emitting structure disposed on the first electrode, and a second electrode disposed on the light emitting structure. The light emitting colors of the sub-pixels in the same sub-pixel group are the same. When each of the sub-pixel groups 11, 12, 13 includes at least two sub-pixels 111, 121, and 131, and a plurality of first electrodes of a plurality of sub-pixels in each of the sub-pixel groups are electrically connected in sequence. That is, the first electrodes of two adjacent sub-pixels in the sub-pixel group are electrically connected to each other. A pixel circuit 21 for driving the sub-pixel groups 11, 12, and 13 is arranged in the second display area 120. In an example, in the second display area 120, a plurality of pixel circuits 21 corresponding to the sub-pixel groups one-to-one are provided. The pixel circuits corresponding to the sub-pixel groups 11, 12, and 13 in the first display area 110 are arranged in the second display area 120, which can effectively increase the light transmittance of the first display area 110 and reduce the structural complexity of the first display area 110. It can further reduce the diffraction effect generated when external light passes through the first display area 110, thereby improving the imaging quality of the camera arranged under the first display area 110.

Among the sub-pixel groups 11, 12, and 13 of each pixel unit in the first display area 110, at least one first electrode of at least one sub-pixel of at least one sub-pixel group 11, 12, and 13 of the pixel units is electrically connected to at least one corresponding pixel circuit 21 through at least one first connecting portion, and at least one first electrode of at least one sub-pixel of at least one of other sub-pixel groups 11, 12, 13 of the pixel unit is electrically connected to at least one corresponding pixel circuit 21 through a second connecting portion. The at least one first connecting portion and the at least one second connecting portion are disposed in different layers, so that a larger number of such first connecting portions and second connecting portions can be provided. The at least one second connecting portion and a plurality of first electrodes of a plurality of sub-pixels of the sub-pixel groups of the pixel unit are disposed in different layers, and because the total number of the first connecting portions and the second connecting portions is the same as the number of sub-pixel groups, more sub-pixel groups can be provided, which can effectively increase the pixel density of the first display area 110, thereby improving display effect of the display area 110.

In an example, the sub-pixel group includes one first electrode, and the first electrode is connected to a pixel circuit corresponding to the sub-pixel group. In an example, the sub-pixel group includes at least two first electrodes, and one of the first electrodes is connected to the pixel circuit corresponding to the sub-pixel group. Here, the pixel circuit driving the sub-pixel group refers to that the pixel circuit drives the sub-pixels in the sub-pixel group at the same time.

In an example, the first electrode can be an anode, the second electrode can be a cathode, and the cathodes of the plurality of sub-pixel groups in the first display area 110 can be connected as a surface electrode.

Figure 3:
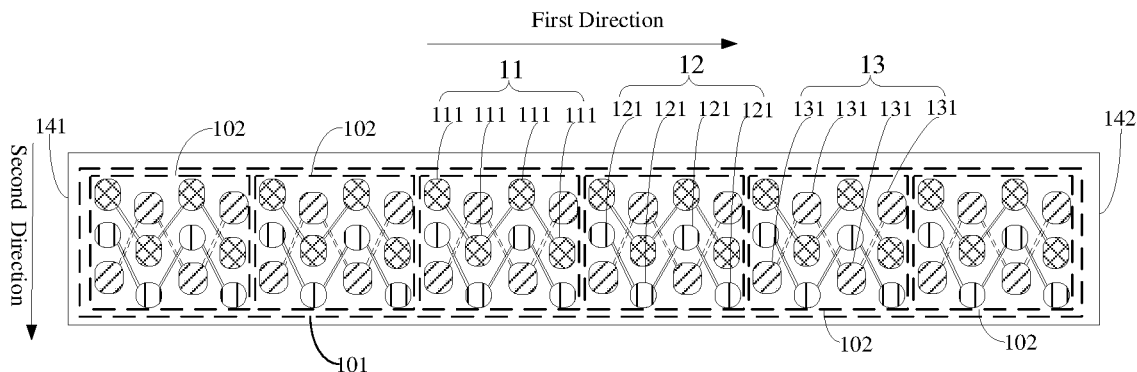
FIG. 3 is a partial schematic diagram of arrangement of sub-pixel groups in a first display area of a display substrate shown in FIG. 1.

In an example, as shown in FIGS. 2 and 3, the first display area 110 includes a first side 141 and a second side 142 opposite to the first side 141. The direction from the side 141 to the second side 142 refers to as a first direction.

The plurality of pixel units 10 in the first display area 110 form a plurality of pixel unit groups 101, and the plurality of pixel units in each of the pixel unit groups 101 are arranged along the first direction. Among the plurality of pixel units 10 in each of the pixel unit groups 101, at least one pixel unit 10 adjacent to the first side 141 is a first target pixel unit 102, a distance between the first target pixel unit 102 adjacent to the first side 141 and the first side 141 is smaller than a distance between any of other pixel units 10 and the first side 141. In addition or alternatively, among the plurality of pixel units 10 in each of the pixel unit groups 101, at least one pixel unit 10 adjacent to the second side 142 is a second target pixel unit 102, a distance between the second target pixel unit 102 adjacent to the second side 142 and the second side 142 is smaller than a distance between any of other pixel units 10 and the second side 142.

In an example, as shown in FIG. 3, each pixel unit group 101 includes six pixel units 10, the number of the first target pixel units 102 adjacent to the first side 141 of the first display area 110 is two, and the number of the second target pixel units 102 adjacent to the second side 142 of the first display area 110 is two. In other examples, the number of pixel units 10 in each pixel unit group can be other than six.

In an example, as shown in FIGS. 4 to 7, the sub-pixel groups are arranged substantially along the first direction, and when the sub-pixel group includes at least two sub-pixels, the at least two sub-pixels in the same sub-pixel group are arranged at intervals along the first direction. At least two sub-pixels in the same sub-pixel group are arranged at intervals along the first direction, which refers to that a distance N between central axes of the at least two sub-pixels in the first direction, where N is greater than or equal to zero.

Figure 5:
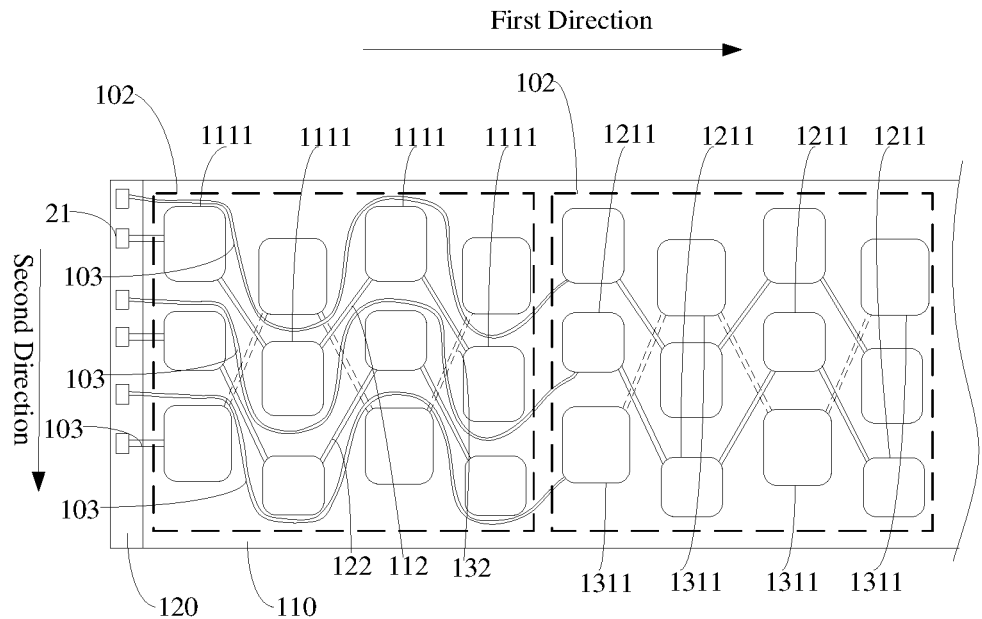
FIG. 5 is a partial schematic diagram of a first electrode arrangement in a display substrate shown in FIG. 4.
Figure 7:
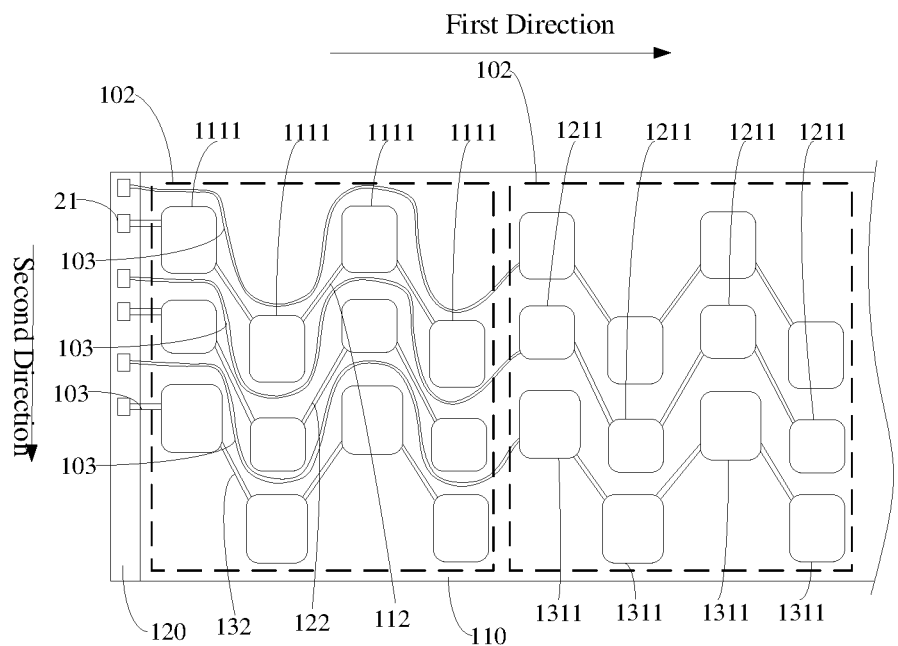
FIG. 7 is a partial schematic diagram of a first electrode arrangement in a display substrate shown in FIG. 6.

In an example, at least one first electrode 1111, 1211, 1311 of at least one sub-pixel of at least one sub-pixel group 11, 12, 13 in the first target pixel unit 102 is electrically connected to at least one corresponding pixel circuit 21 through at least one first connecting portion 103; at least one first electrode of at least one sub-pixel of at least one sub-pixel group in the second target pixel unit is electrically connected to at least one corresponding pixel circuit through at least one first connecting portion. One first electrode 1111, 1211, 1311 of the other sub-pixel groups 11, 12, 13 in the first display area 110 can all be electrically connected to the corresponding pixel circuit 21 through the second connecting portion. In an example, as shown in FIGS. 5 and 7, the sub-pixel 111 includes a first electrode 1111, the sub-pixel 121 includes a first electrode 1211, and the sub-pixel 131 includes a first electrode 1311. One first electrode of at least one sub-pixel group in each target pixel unit 102 is electrically connected to one first electrode of at least one sub-pixel group in other target pixel unit 102 through the first connecting portion 103, so that the number of the first connecting portions 103 is larger. When the number of second connecting portions is constant, the total number of the first connecting portions 103 and the second connecting portions in the display area 110 is relatively large, so that more sub-pixel groups can be arranged in the first display area 110, and the pixel density of the first display area 110 can be effectively increased.

Figure 4:
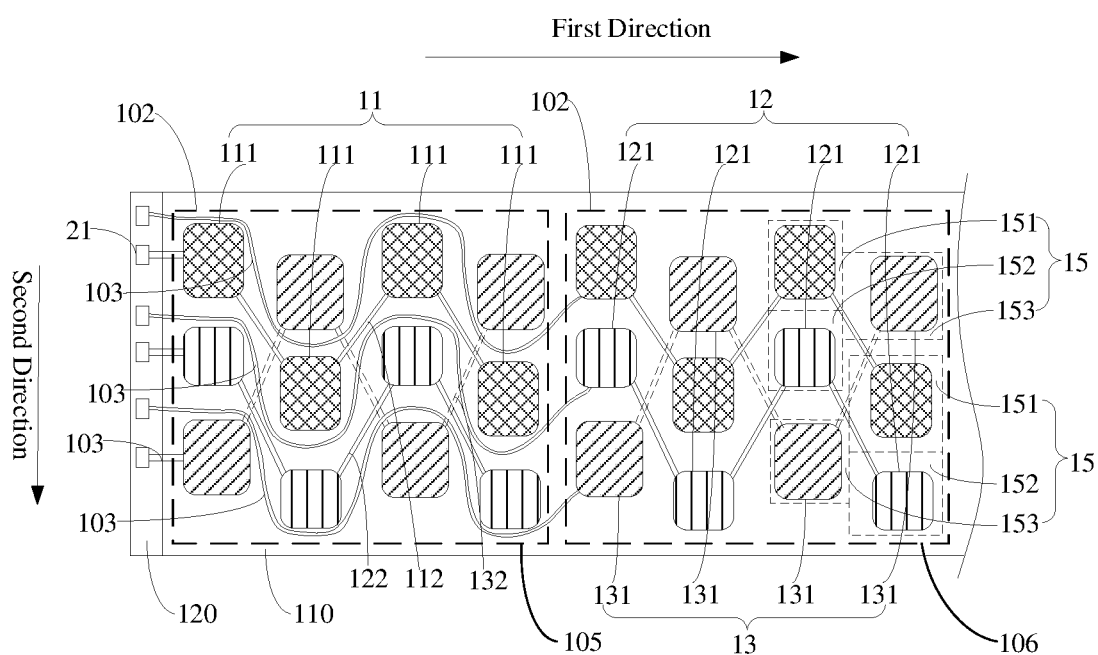
FIG. 4 is a partial schematic diagram of arrangement of sub-pixel groups in a display substrate shown in FIG. 1.
Figure 6:
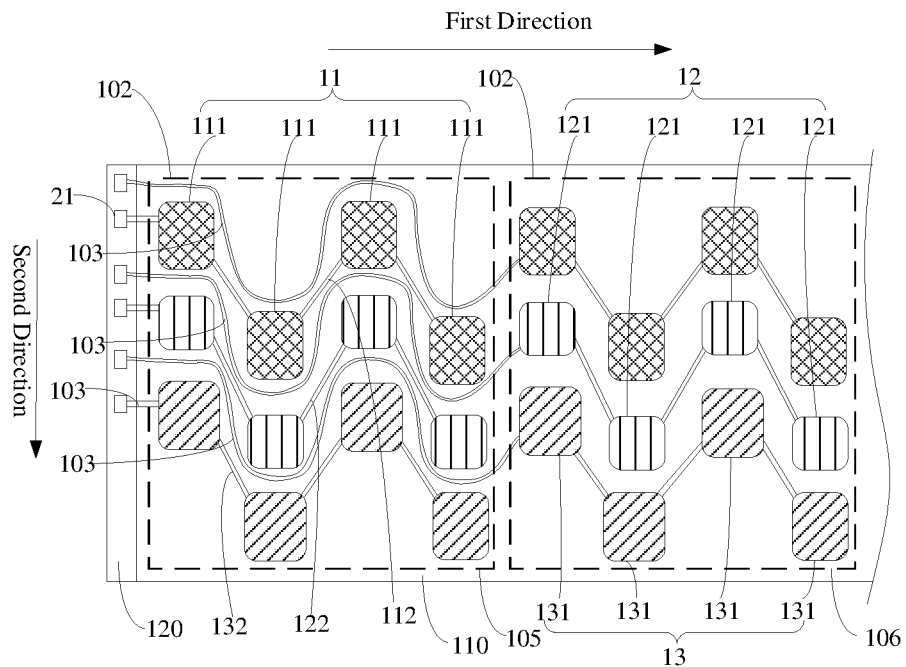
FIG. 6 is another partial schematic diagram of arrangement of sub-pixel groups in a display substrate shown in FIG. 1.

In one example, as shown in FIGS. 4 and 6, in the first display area 110, a plurality of first electrodes 1111, 1211, 1311 of a plurality of sub-pixels of the sub-pixel groups 11, 12, 13 in the first target pixel unit 102 are electrically connected to a plurality of corresponding pixel circuit 21 through a plurality of first connecting portion 103, a plurality of first electrodes of a plurality of sub-pixels of the sub-pixel groups in the second target pixel unit are electrically connected to a plurality of corresponding pixel circuits through a plurality of first connecting portions. With this arrangement, the number of the first connecting portions 103 can be increased. When the number of the second connecting portions in the first display area 110 is fixed, the total number of the first connecting portions 103 and the second connecting portions can be increased, thereby making the number of sub-pixel groups 11, 12, and 13 in the first display area 110 increase, which in turn increasing the density of the sub-pixel groups in the first display area 110.

In one example, in each pixel unit group 101 of the first display area 110, one or two of the pixel units 10 adjacent to the first side 141 of the first display area 110 are first the target pixel units 102, and/or one or two of the pixel units 10 adjacent to the second side 142 of the first display area 110 are the second target pixel units 102. The pixel units other than the target pixel units 102 in the first display area 110 are referred to as second type of pixel units, and one first electrode of the sub-pixel groups in the second type of pixel units can be connected to the corresponding pixel circuit through the second connecting portion. In an example, as shown in FIGS. 4 and 6, two pixel units 10 adjacent to the first side 141 of the first display area 110 are both target pixel units 102, and two pixel units 10 adjacent to the second side 142 of the first display area 110 are both target pixel units 102. With this arrangement, on the one hand, the number of the first connecting portions 103 can be increased, and the total number of the first connecting portions 103 and the second connecting portions can be increased, so that the number of sub-pixel groups 11, 12, and 13 in the first display area 110 can be increased, which can effectively increase the density of the sub-pixel groups in the first display area 110. On the other hand, it can effectively avoid the excessive number of target pixel units adjacent to the first side 141 or adjacent to the second side 142, which can result in excessively long distances between the first electrodes of the sub-pixel groups in some target pixel units and the corresponding pixel circuits. Since if the distance is too long, the length of the first connecting portion has to be longer, thereby the above arrangement can effectively avoid the influence of the wiring method of the first connecting portion on the arrangement of the first electrode.

In an example, in each pixel unit group 101 of the first display area 110, one or two of the pixel units 10 adjacent to the first side 141 of the first display area 110 are target pixel units 102, and one or two of the pixel units 10 adjacent to the second side 142 of the first display area 110 are target pixel units 102, and one first electrode of each sub-pixel group in the target pixel unit 102 is electrically connected through the first connecting portion 103. In this way, the number of the first connecting portions 103 can be made larger without affecting the size and number of the first electrodes.

In an example, each sub-pixel group in the first display area 110 can include a plurality of sub-pixels, and the first electrodes of two adjacent sub-pixels in the same sub-pixel group can be electrically connected by a wire. As shown in FIGS. 4 to 7, the sub-pixel group 11 includes four sub-pixels 111 arranged at intervals along the first direction, and the first electrodes 1111 of two adjacent sub-pixels 111 of the sub-pixel group 11 are connected by a wiring 112. The pixel group 12 includes four sub-pixels 121 arranged at intervals along the first direction. The first electrodes 1211 of two adjacent sub-pixels 121 of the sub-pixel group 12 are connected by a wiring 122. The sub-pixel group 13 includes four sub-pixels 131 arranged at intervals in the first direction, and the first electrodes 1311 of two adjacent sub-pixels 131 of the sub-pixel group 13 are connected by a wiring 132. FIGS. 4 and 5 only take as an example that each sub-pixel group includes four sub-pixels. In other examples, the number of sub-pixels in the sub-pixel group can be other than four.

Among the at least two sub-pixels in the sub-pixel group, the first electrode of the sub-pixel closest to the second display area 120 is electrically connected to the corresponding pixel circuit. With this arrangement, the length of the connecting portion between the first electrode and the pixel circuit can be reduced, the transparency of the first display area can be effectively improved, and the diffraction intensity generated when external light passes through the first display area can be reduced. As shown in FIGS. 5 and 7, in the two target pixel units 102, among the four first electrodes 1111 of the sub-pixel group 11, the first electrode 1111 closest to the second display area 120 is electrically connected to the corresponding pixel circuit 21. Among the four first electrodes 1211 of the sub-pixel group 12, the first electrode 1211 closest to the second display area 120 is electrically connected to the corresponding pixel circuit 21. Among the four first electrodes 1311 of the sub-pixel group 13, the first electrode 1311 closest to the second display area 120 is electrically connected to the corresponding pixel circuit 21. Among the plurality of sub-pixel groups of other pixel units in the first display area except the target pixel units, the first electrode of the sub-pixel closest to the second display area 120 in each sub-pixel group is connected to the corresponding pixel circuit through the second connecting portion.

In one example, as shown in FIGS. 4 and 6, the pixel unit 10 includes a first sub-pixel group 11 emitting light of a first color, a second sub-pixel group 12 emitting light of a second color, and a third sub-pixel group 13 emitting light of a third color. The first sub-pixel group 11 includes at least two sub-pixels 111 emitting light of the first color, and the second sub-pixel group 12 includes at least two sub-pixels 121 emitting light of the second color. The third sub-pixel group 13 includes at least two sub-pixels 131 emitting light of the third color.

In an example, the pixel unit 10 includes a plurality of sub-pixel units 15, and each of the sub-pixel units 15 includes a sub-pixel 111 emitting light of a first color, a sub-pixel 121 emitting light of a second color, and a sub-pixel 131 emitting light of a third color. Three sub-pixels 111, 121, and 131 in each of the sub-pixel units 15 are arranged in a triangle shape.

In an example, each of the plurality of sub-pixel units 15 includes a first area 151, a second area 152, and a third area 153. The first area 151 and the second area 152 are arranged in a second direction, so the third area 153 and the first area 151 are arranged in the first direction, and a first central axis of a total area of the first area 151 and the second area 152 along the first direction substantially coincides with a second central axis of the third area 153 along the first direction. Here, that the first central axis substantially coincides with the second central axis means that the first central axis and the second central axis completely coincide, or have a distance in the second direction within a threshold range. In one example, the threshold is 40 micrometers. The sub-pixel 111 emitting light of the first color is disposed in the first area 151, the sub-pixel 121 emitting light of the second color is disposed in the second area 152, and the sub-pixel 131 emitting light of the third color is disposed in the third area 153. Among two adjacent sub-pixel units 15 in the second direction, the third area 153 of one sub-pixel unit 15 is disposed on a third side of the first area 151 of the sub-pixel unit, and the third area 153 of the other sub-pixel unit 15 is disposed on a fourth side of the first area 151 of the other sub-pixel unit, and the third side is opposite to the fourth side. Among the plurality of sub-pixel units 15 arranged in the first direction, the third area of each of the plurality of sub-pixel units is disposed on a third/fourth side of the first area 151.

With this arrangement, in the first direction or the second direction, the sub-pixels 111 emitting light of the first color, the sub-pixels 121 emitting light of the second color, and the sub-pixels 131 emitting light of the third color are uniformly distributed in the first display area 110, which can avoid a plurality of sub-pixels of the same color being adjacent to one another in a certain area of the first display area, to cause uneven color distribution during display, and to further cause the problem of single-color bright stripes in the area, and which can effectively improve the display effect. In addition, the sub-pixels 111, 121, and 131 of the same color are distributed relatively uniformly, so that the mask openings used in the light emitting structure of the sub-pixels can be arranged more regularly, which can reduce the wrinkles of the mask.

In one example, the pixel unit includes three sub-pixel groups with different light emitting colors. The three light emitting colors can be red, green and blue respectively. The first color, the second color, and the third color are the three different colors mentioned above. For example, the first color is red, the second color is green, and the third color is blue; or, the first color is red, the second color is blue, and the third color is green. In other examples, when the pixel unit includes sub-pixel groups of three light emitting colors, the three colors can be other colors. In some examples, the pixel unit can include sub-pixel groups of more than three light emitting colors.

In an example, as shown in FIGS. 4 and 5, the pixel unit group 101 includes two first target pixel units 102 adjacent to the first side 141, and/or the pixel unit group includes two second target pixel units 102 adjacent to the second side 142. Among the two first target pixel units 102 adjacent to the first side 141 or the two second target pixel units 102 adjacent to the second side 142, the first/second target pixel unit 102 adjacent to the second display area 120 is a first pixel unit 105, and the other first/second target pixel unit is a second pixel unit 106.

In an example, the sub-pixels in the sub-pixel unit 15 in each pixel unit 10 are arranged in a triangle shape, and the first connecting portion 103 corresponding to the first sub-pixel group 11 emitting light of the first color in the second pixel unit 106 is disposed on a side of the first sub-pixel group 11 emitting light of the first color in the first pixel unit 105 facing away from the second sub-pixel group 12 emitting light of the second color in the first pixel unit 105. The first connecting portion 103 corresponding to the second sub-pixel group 12 emitting light of the second color in the second pixel unit 106 is disposed between the second sub-pixel group 12 emitting light of the second color in the first pixel unit 105 and the first sub-pixel group 11 emitting light of the first color in the first pixel unit 105. The first connecting portion 103 corresponding to the third sub-pixel group 13 emitting light of the third color in the second pixel unit 106 is disposed on a side of the second sub-pixel group 12 emitting light of the second color in the first pixel unit 105 facing away from the first sub-pixel group 11 emitting light of the first color in the first pixel unit 105.

With this arrangement, the position of the connecting portion 103 corresponding to each sub-pixel group in the second pixel unit 106 is relatively reasonable, and has a small effect on the size of the sub-pixel group.

In an example, the display substrate 100 can include a substrate, and each sub-pixel group in the first display area 110 is disposed over the substrate. In the pixel arrangement shown in FIG. 4, a projection of the wiring 132 on the substrate intersects a projection of the wiring 112 and the wiring 122 on the substrate respectively, and the projections of the wiring 112 and the wiring 122 on the substrate do not intersect with each other. Therefore, the wiring 112 and the wiring 122 can be arranged on the same layer, and the wiring 132 and the wiring 112 can be arranged on different layers. In one example, the wiring 112 and the wiring 122 can be disposed in the same layer as the first electrode of the sub-pixel group. The wiring 132 can be disposed under the first electrode.

In another example, the arrangement of the sub-pixel groups in the pixel unit 10 can be as shown in FIG. 6. The three sub-pixel groups are arranged in the second direction, and the second sub-pixel group 12 emitting light of the second color is disposed between the first sub-pixel group 11 emitting light of the first color and the third sub-pixel group 13 emitting light of the third color. The first connecting portion 103 corresponding to the first sub-pixel group 11 emitting light of the first color in the second pixel unit 106 is disposed on a side of the first sub-pixel group 11 emitting light of the first color in the first pixel unit 105 facing away from the second sub-pixel group 12 emitting light of the second color in the first pixel unit 105. The first connecting portion 103 corresponding to the second sub-pixel group 12 emitting light of the second color in the second pixel unit 106 is disposed between the first sub-pixel group 11 emitting light of the first color in the first pixel unit 105 and the second sub-pixel group 12 emitting light of the second color in the first pixel unit 105. The first connecting portion 103 corresponding to the third sub-pixel group 13 emitting light of the third color in the second pixel unit 106 is disposed between the sub-pixel group 13 emitting light of the third color in the first pixel unit 105 and the second sub-pixel group 12 emitting light of the second color in the first pixel unit 105. The extending direction of the first connecting portion 103 corresponding to each sub-pixel group in the second pixel unit 106 is approximately the same as the extending direction of the wirings 112, 122, 132 between the first electrodes of the sub-pixel group in the first pixel unit 105.

In the pixel arrangement shown in FIG. 6 and FIG. 7, the projection of the wiring 132 on the substrate, the projection of the wiring 112 on the substrate, and the projection of the wiring 122 on the substrate do not intersect with one another. The wiring 112, the wiring 122, and the wiring 132 can be arranged on the same layer. In one example, the wiring 112, the wiring 122, and the wiring 132 can be arranged on the same layer as the first electrode of the sub-pixel group.

Figure 8:
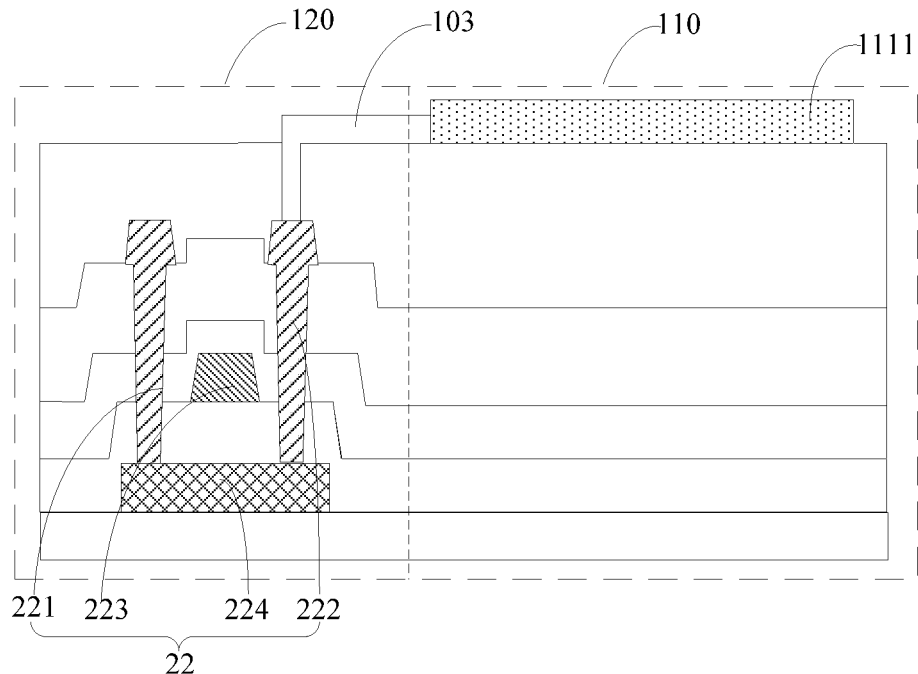
FIG. 8 is a cross-sectional view of a first electrode in a display substrate shown in FIG. 1 being connected to a pixel circuit through a first connecting portion.
Figure 9:
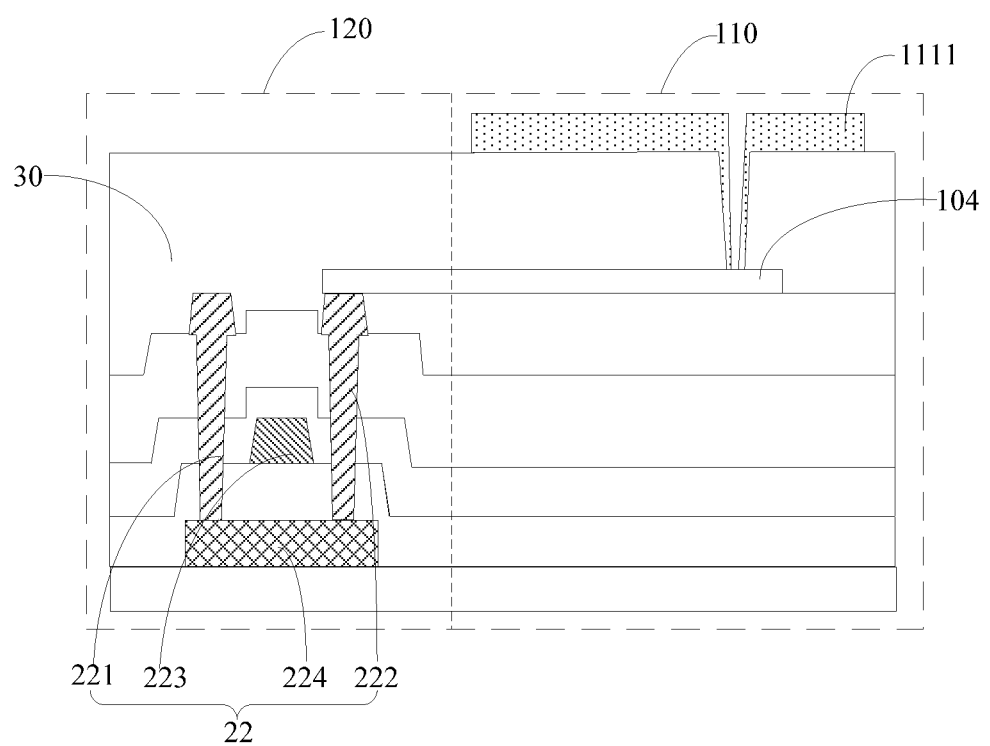
FIG. 9 is a cross-sectional view of a first electrode in a display substrate shown in FIG. 1 being connected to a pixel circuit through a second connecting portion.

In one example, as shown in FIGS. 8 and 9, a pixel circuit for driving a sub-pixel group includes a transistor 22, and the transistor 22 includes a source electrode 221, a drain electrode 222, a gate electrode 223, and a semiconductor layer 224. The drain electrode 222 of the transistor 22 is electrically connected to a first electrode 1111 of the sub-pixel group. In an example, the first electrode is electrically connected to the drain electrode 222 of the transistor 22 through the first connecting portion 103 or the second connecting portion 104. In an example, as shown in FIGS. 8 and 9, one first electrode 1111 of the sub-pixel group 11 is connected to the corresponding pixel circuit through the first connecting portion 103 and the second connecting portion 104, and one first electrode 1211 of the sub-pixel group 12 and one first electrode 1311 of the sub-pixel group 13 are connected to the corresponding pixel circuits through the first connecting portion 103 and the second connecting portion 104, and the schematic diagrams of the structure are similar to those in FIGS. 8 and 9.

In an example, as shown in FIG. 8, the at least one first connecting portion 103 and the at least one first electrode are disposed on a same layer. With this arrangement, when the material of the first connecting portion 103 and the first electrode of the sub-pixel group are the same, the first connecting portion 103 and the first electrode of the sub-pixel group can be formed in the same process step, which can simplify the production process of the display substrate 100. When the material of the first connecting portion 103 and the first electrode of the sub-pixel group are the same, the first connecting portion 103 and the first electrode can both have a sandwich structure. The sandwich structure includes two layers of indium tin oxide and silver between the two layers of indium tin oxide. In an example, the materials of the first connecting portion 103 and the first electrode of the sub-pixel group can be different. For example, the first electrode includes two layers of indium tin oxide and silver disposed between the two layers of indium tin oxide. The material of the first connecting portion 103 can be indium tin oxide or indium zinc oxide.

In one example, as shown in FIG. 9, the at least one second connecting portion 104 is disposed under the at least one first electrode, and an insulating layer 30 is disposed between the at least one second connecting portion 104 and the at least one first electrode, The insulating layer 30 is provided with at least one contact hole, and the at least one second connecting portion 104 is electrically connected to the at least one first electrode through the at least one contact hole. The second connecting portion 104 is arranged under the first electrode, and the arrangement of the second connecting portion 104 will not affect the size of the first electrode, so that a larger-sized first electrode can be arranged, thereby effectively increasing the effective display area of the first display area 110. In an example, the insulating layer 30 can be a planarization layer.

In one example, the material of the first connecting portion 103, the second connecting portion 104 and/or the first electrode includes indium tin oxide, or indium zinc oxide, or oxide indium tin doped with silver or indium zinc oxide doped with silver. In an example, the material of the first connecting portion 103, the second connecting portion 104 and/or the first electrode can be indium tin oxide doped with silver or indium zinc oxide doped with silver to ensure the high light transmittance of the first display area 110 while effectively reducing the resistance of the first connecting portion 103, the second connecting portion 104 and/or the first electrode.

In one example, the display substrate 100 includes a substrate, the first electrode is disposed over the substrate, and a projection of the first electrode on the substrate includes at least one first pattern unit. In one example, the first pattern unit can include a circle shape, an oval shape, a dumbbell-like shape, a figure "8" shape or a rectangle shape, so that the periodic structure generated by diffraction can be changed, that is, the distribution of the diffraction field is changed, thereby reducing diffraction effect caused by the passage of external incident light. Moreover, the shape of the first image unit causes the size of the first electrode in the second direction to continuously change or intermittently change, so that the distance between two adjacent first electrodes in the first direction changes continuously or intermittently in the second direction. The change makes the two adjacent first electrodes diffracted at different positions, and the diffraction effects at different positions cancel each other out, which can effectively reduce the diffraction effect, thereby ensuring that the image taken by the camera set below the first display area has a higher clarity.

In one example, a light emitting structure disposed on the first electrode includes a light emitting structure disposed on each first electrode. The projection of the light emitting structure on the first electrode on the substrate includes at least one second pattern unit, the second pattern unit is the same as or different from the first pattern unit, so that the projection of the light emitting structure corresponding to the first electrode on the substrate is different from the projection of the first electrode on the substrate, thereby further reducing the diffraction effect generated when light passes through the first display area 110.

In an example, the second pattern unit includes a circle shape, an oval shape, a dumbbell-like shape, a figure "8" shape or a rectangle shape.

In one example, the first direction and the second direction can be perpendicular to each other. Here, the first direction can be a row direction, and the second direction can be a column direction. Alternatively, the first direction can be a column direction, and the second direction can be a row direction.

In an example, a plurality of pixels are provided in the second display area 120, and the density of the pixels in the second display area 120 can be smaller than the density of the sub-pixel group.

The first display area 110 of the display substrate 100 provided by the embodiment of the present application can be in the shape of a waterdrop-like shape, a circle shape, a rectangle shape, a semicircle shape, a semi-oval shape, or an oval shape, but is not limited thereto.

An embodiment of the present application also provides a display panel, which includes the display substrate described in any of the foregoing examples and an encapsulation layer. The encapsulation layer can include a polarizer, which covers the second display area 120 and does not cover the first display area 110, or the polarizer covers both of the first display area 110 and the second display area 120.

The polarizer can dissipate the reflected light on the surface of the display panel and improve the user experience. When the first display area 110 is not provided with a polarizer, the light transmittance of the first display area 110 can be increased, and the normal operation of the photosensitive device disposed under the first display area 110 can be effectively ensured.

In one example, the first display area 110 is at least partially surrounded by the second display area 120. As shown in FIG. 1, the first display area 110 is partially surrounded by the second display area 120. In other examples, the first display area 110 is completely surrounded by the second display area 120.

An embodiment of the present application also provides a display device. The display device includes a device body and the above-mentioned display substrate or display panel. The device body has a component area, and the display panel covers the device body. The component area is disposed under the first display area 110, and t least one photosensitive component emitting or collecting light through the first display area 110 is arranged in the component area.

The photosensitive device can include a camera and/or a light sensor. Devices other than photosensitive devices, such as gyroscopes or earpieces, can also be arranged in the component area. The component area can be a grooved area, and the first display area of the display panel can be arranged in close contact with the grooved area, so that the photosensitive device can emit or collect light through the first display area.

The above-mentioned display device can be a digital device such as a mobile phone, a tablet, a handheld computer, or an iPod.

In the drawings, the sizes of layers and areas in the figures can be exaggerated for clarity of illustration. In addition, when an element or layer is referred to as being "on" or "under" another element or layer, it can be directly on or under the other element or layer, or there can be more than one intervening element or layer. When an element is referred to as being "between" two layers or two elements, it can be the only layer or element between the two layers or two elements, or more than one intervening layer or element can also be present.

In this application, the terms "first" and "second" are only used for descriptive purposes, and cannot be understood as indicating or implying relative importance. The term "plurality" refers to two or more, unless specifically defined otherwise.

It should be understood that the present application is not limited to the precise structure that has been described above and shown in the drawings, and various modifications and changes can be made without departing from its scope. The scope of the application is only limited by the appended claims.

What is claimed is:

1. A display substrate comprises:
   a first display area comprising a plurality of pixel units, and each of the plurality of pixel units comprising at least three sub-pixel groups emitting light of at least three different colors;
   each of the sub-pixel groups comprising at least one sub-pixel, and each sub-pixel comprising a first electrode, a light emitting structure disposed on the first electrode and a second electrode disposed on the light emitting structure; and
   a second display area being adjacent to the first display area, a light transmittance of the second display area being lower than a light transmittance of the first display area; the second display area being provided with a plurality of pixel circuits for driving the sub-pixel groups;
   wherein among the sub-pixel groups of each pixel unit in the first display area, at least one first electrode of at least one sub-pixel of at least one sub-pixel group of the pixel unit is electrically connected to at least one corresponding pixel circuit through at least one first connecting portion, and at least one first electrode of at least one sub-pixel of at least one of the other sub-pixel groups of the pixel unit is electrically connected to at least one corresponding pixel circuit through at least one second connecting portion, the at least one first connecting portion and the at least one second connecting portion are disposed in different layers, and the at least one second connecting portion and a plurality of first electrodes of a plurality of sub-pixels of the sub-pixel groups of the pixel unit are disposed in different layers.

2. The display substrate of claim 1, wherein each of the sub-pixel groups comprises at least two sub-pixels, and a plurality of first electrodes of a plurality of sub-pixels in each of the sub-pixel groups are electrically connected in sequence.

3. The display substrate of claim 1, wherein the plurality of pixel units form a plurality of pixel unit groups, and the plurality of pixel units in each of the pixel unit groups arranged along a first direction, and the plurality of pixel unit groups are arranged along a second direction;
   the first display area comprises a first side and a second side opposite to the first side, and a direction from the first side to the second side is the first direction.

4. The display substrate of claim 3, wherein among the plurality of pixel units in each of the pixel unit groups, at least one pixel unit adjacent to the first side is a first target pixel unit, a distance between the first target pixel unit adjacent to the first side and the first side is smaller than a distance between any of other pixel units and the first side; and/or, among the plurality of pixel units in each of the pixel unit groups, at least one pixel unit adjacent to the second side is a second target pixel unit, a distance between the second target pixel unit adjacent to the second side and the second side is smaller than a distance between any of other pixel units and the second side.

5. The display substrate of claim 4, wherein at least one first electrode of at least one sub-pixel of at least one sub-pixel group in the first target pixel unit is electrically connected to at least one corresponding pixel circuit through at least one first connecting portion; at least one first electrode of at least one sub-pixel of at least one sub-pixel group in the second target pixel unit is electrically connected to at least one corresponding pixel circuit through at least one first connecting portion.

6. The display substrate of claim 4, wherein in the pixel unit group, one or two pixel units adjacent to the first side are the first target pixel units, and/or, one or two pixel units adjacent to the second side are the second target pixel units.

7. The display substrate of claim 6, wherein the pixel unit group comprises six pixel units, the number of the first target pixel units adjacent to the first side is two, and the number of the second target pixel units adjacent to the second side is two.

8. The display substrate of claim 4, wherein in the first display area, a plurality of first electrodes of a plurality of sub-pixels of the sub-pixel groups in the first target pixel unit are electrically connected to a plurality of corresponding pixel circuits through a plurality of first connecting portions, a plurality of first electrodes of a plurality of sub-pixels of the sub-pixel groups in the second target pixel unit are electrically connected to a plurality of corresponding pixel circuits through a plurality of first connecting portions.

9. The display substrate of claim 4, wherein the pixel unit comprises a first sub-pixel group emitting light of a first color, a second sub-pixel group emitting light of a second color and a third sub-pixel group emitting light of a third color; the first sub-pixel group comprises at least two sub-pixels emitting light of the first color, the second sub-pixel group comprises at least two sub-pixels emitting light of the second color, and the third sub-pixel group comprises at least two sub-pixels emitting light of the third color.

10. The display substrate of claim 9, wherein the pixel unit group comprises two first target pixel units adjacent to the first side, and/or, the pixel unit group comprises two second target pixel units adjacent to the second side; wherein among the two first target pixel units adjacent to the first side or among the two second target pixel units adjacent to the second side, the first/second target pixel unit adjacent to the second display area is a first pixel unit, and the other first/second target pixel unit is a second pixel unit.

11. The display substrate of claim 10, wherein the pixel unit comprises a plurality of sub-pixel units, and each of the sub-pixel units comprises a sub-pixel emitting light of a first color, a sub-pixel emitting light of a second color and a sub-pixel emitting light of a third color, and three sub-pixels in each of the sub-pixel units are arranged in a triangle shape.

12. The display substrate of claim 11, wherein each of the plurality of sub-pixel units comprises a first area, a second area and a third area, the first area and the second area are arranged in a second direction, the third area and the first area are arranged in the first direction, and a first central axis of a total area of the first area and the second area along the first direction substantially coincides with a second central axis of the third area along the first direction; the sub-pixel emitting light of the first color is disposed in the first area, the sub-pixel emitting light of the second color is disposed in the second area, and the sub-pixel emitting light of the third color is disposed in the third area;
among two adjacent sub-pixel units in the second direction, the third area of one sub-pixel unit is disposed on a third side of the first area of the sub-pixel unit, and the third area of the other sub-pixel unit is disposed on a fourth side of the first area of the other sub-pixel unit, the third side is opposite to the fourth side;
among the plurality of sub-pixel units arranged in the first direction, the third area of each of the plurality of sub-pixel units is disposed on a third/fourth side of the first area.

13. The display substrate of claim 12, wherein the first connecting portion corresponding to the second sub-pixel group emitting light of the first color in the second pixel unit is disposed on a side of the first sub-pixel group emitting light of the first color in the first pixel unit facing away from the second sub-pixel group emitting light of the second color in the first pixel unit;
the first connecting portion corresponding to the second sub-pixel group emitting light of the second color in the second pixel unit is disposed between the second sub-pixel group emitting light of the second color in the first pixel unit and the first sub-pixel group emitting light of the first color in the first pixel unit;
the first connecting portion corresponding to the third sub-pixel group emitting light of the third color in the second pixel unit is disposed on a side of the second sub-pixel group emitting light of the second color in the first pixel unit facing away from the first sub-pixel group emitting light of the first color in the first pixel unit.

14. The display substrate of claim 10, wherein three sub-pixel groups are arranged in the second direction, and the second sub-pixel group emitting light of the second color is disposed between the first sub-pixel group emitting light of the first color and the third sub-pixel group emitting light of the third color.

15. The display substrate of claim 14, wherein the first connecting portion corresponding to the first sub-pixel group emitting light of the first color in the second pixel unit is disposed on a side of the first sub-pixel group emitting light of the first color in the first pixel unit facing away from the second sub-pixel group emitting light of the second color in the first pixel unit;
the first connecting portion corresponding to the second sub-pixel group emitting light of the second color in the second pixel unit is disposed between the first sub-pixel group emitting light of the first color in the first pixel unit and the second sub-pixel group emitting light of the second color in the first pixel unit;
the first connecting portion corresponding to the third sub-pixel group emitting light of the third color in the second pixel unit is disposed between the third sub-pixel group emitting light of the third color in the first pixel unit and the second sub-pixel group emitting light of the second color in the first pixel unit.

16. The display substrate of claim 1, wherein the at least one first connecting portion and the at least one first electrode are disposed on a same layer, and the at least one second connecting portion is disposed under the at least one first electrode.

17. The display substrate of claim 1, further comprising an insulating layer disposed between the at least one second connecting portion and the at least one first electrode, the insulating layer is provided with at least one contact hole, and the at least one second connecting portion is electrically connected to the at least one first electrode through the at least one contact hole.

18. The display substrate of claim 1, wherein each of the sub-pixel groups comprises at least two sub-pixels, and the first electrode of the sub-pixel closest to the second display area is electrically connected to the corresponding pixel circuit.

19. The display substrate of claim 1, wherein a material of the first connecting portion, the second connecting portion, the first electrode and/or the second electrode comprises indium tin oxide, indium zinc oxide, indium tin oxide doped with silver or indium zinc oxide doped with silver.

20. A display device, comprising:
a device body has a component area;
a display substrate of claim 1, the display substrate covering the device body;
wherein the component area is disposed under the first display area, and at least one photosensitive component emitting or collecting light through the first display area is disposed in the component area.

* * * * *